(12) United States Patent
Lee et al.

(10) Patent No.: US 10,056,466 B2
(45) Date of Patent: Aug. 21, 2018

(54) METHODS FOR FABRICATING SEMICONDUCTOR DEVICE

(71) Applicant: Samsung Electronics Co., Ltd., Suwon-si (KR)

(72) Inventors: Seung-Jae Lee, Seoul (KR); Ja-Eung Koo, Yongin-si (KR); Ho-Young Kim, Seongnam-si (KR); Yeong-Bong Park, Seoul (KR); Il-Su Park, Seoul (KR); Bo-Un Yoon, Seoul (KR); Il-Young Yoon, Hwaseong-si (KR); Youn-Su Ha, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/191,555

(22) Filed: Jun. 24, 2016

(65) Prior Publication Data
US 2017/0040436 A1   Feb. 9, 2017

(30) Foreign Application Priority Data
Aug. 6, 2015   (KR) .......................... 10-2015-0111043

(51) Int. Cl.
*H01L 29/66* (2006.01)
*H01L 21/321* (2006.01)
(Continued)

(52) U.S. Cl.
CPC .. *H01L 29/66545* (2013.01); *H01L 21/31051* (2013.01); *H01L 21/3212* (2013.01);
(Continued)

(58) Field of Classification Search
CPC ............................. H01L 21/31051–21/31056; H01L 21/823456; H01L 21/823857;
(Continued)

(56) References Cited

U.S. PATENT DOCUMENTS

| 6,563,178 B2 | 5/2003 | Moriwaki et al. |
| 7,078,278 B2 | 7/2006 | Pan et al. |

(Continued)

FOREIGN PATENT DOCUMENTS

| JP | 2003-303963 | 10/2003 |
| JP | 2009-182122 | 8/2009 |
| JP | 2010-129977 | 6/2010 |

*Primary Examiner* — Marvin Payen
*Assistant Examiner* — Jeremy Joy
(74) *Attorney, Agent, or Firm* — Muir Patent Law, PLLC

(57) ABSTRACT

A method for fabricating a semiconductor device may comprise forming a first transistor having a first threshold voltage in a first region of a substrate, forming a second transistor having a second threshold voltage less than the first threshold voltage in a second region of the substrate, forming a third interlayer insulating film in the third region, and planarizing the first transistor, the second transistor and the third interlayer insulating film. The first transistor may include a first gate electrode having a first height and a first interlayer insulating film having the first height, and the second transistor may include a second gate electrode having a second height shorter than the first height and a second interlayer insulating film having the second height. The third interlayer insulating film may have the first height.

20 Claims, 16 Drawing Sheets

(51) Int. Cl.
*H01L 21/3105* (2006.01)
*H01L 21/8234* (2006.01)
*H01L 21/8238* (2006.01)
*H01L 29/49* (2006.01)
*H01L 29/51* (2006.01)

(52) U.S. Cl.
CPC .. *H01L 21/82345* (2013.01); *H01L 21/82385* (2013.01); *H01L 21/823437* (2013.01); *H01L 21/823456* (2013.01); *H01L 21/823462* (2013.01); *H01L 21/823842* (2013.01); *H01L 21/823857* (2013.01); *H01L 29/4966* (2013.01); *H01L 29/517* (2013.01)

(58) Field of Classification Search
CPC ............................ H01L 21/823842–21/82385; H01L 29/66545; H01L 21/32115–21/32125; H01L 21/823437
See application file for complete search history.

(56) References Cited

U.S. PATENT DOCUMENTS

| | | | |
|---|---|---|---|
| 7,452,817 B2 * | 11/2008 | Yoon | H01L 21/31053 257/E21.267 |
| 8,546,211 B2 | 10/2013 | Wong et al. | |
| 8,859,371 B2 | 10/2014 | Song et al. | |
| 8,878,337 B1 * | 11/2014 | Pan | H01L 29/66545 257/532 |
| 2005/0205940 A1 | 9/2005 | Otsuka | |
| 2012/0142157 A1 | 6/2012 | Chen et al. | |
| 2013/0095644 A1 * | 4/2013 | Tu | H01L 21/31053 438/585 |
| 2013/0164930 A1 * | 6/2013 | Tu | H01L 21/31053 438/595 |
| 2013/0234254 A1 | 9/2013 | Ng et al. | |
| 2014/0374814 A1 * | 12/2014 | Wu | H01L 27/11568 257/326 |
| 2015/0037978 A1 * | 2/2015 | Tu | H01L 21/31053 438/692 |
| 2015/0263132 A1 * | 9/2015 | Liu | H01L 29/66545 438/303 |
| 2015/0333063 A1 * | 11/2015 | Shao | H01L 21/31053 257/369 |
| 2016/0056082 A1 * | 2/2016 | Cheng | H01L 21/31053 257/392 |
| 2016/0064285 A1 * | 3/2016 | Moriwaki | H01L 21/3212 438/5 |
| 2016/0190012 A1 * | 6/2016 | Zhu | H01L 21/82343 257/368 |

* cited by examiner

1400

METHODS FOR FABRICATING SEMICONDUCTOR DEVICE

CROSS-REFERENCE TO RELATED APPLICATION

This application claims the benefit of priority under 35 U.S.C. § 119 to Korean Patent Application No. 10-2015-0111043 filed on Aug. 6, 2015 in the Korean Intellectual Property Office, the disclosure of which is incorporated herein in its entirety by reference.

BACKGROUND

1. Technical Field

Example embodiments of the present disclosure relate to methods for fabricating a semiconductor device.

2. Description of the Related Art

A transistor may have an inherent characteristic, such as a threshold voltage (Vth). The threshold voltage may be controlled by varying a thickness of the gate insulation layer of the transistor. Transistors with different thicknesses may be fabricated in the same semiconductor device.

As an example, the respective heights of the gate electrodes constituting the transistor within a same chip may be different from each other based on the variation in the thickness of the gate insulating layer. The variation in the heights of the gate electrodes may introduce weak points in the semiconductor device. Accordingly, the reliability of the semiconductor device having such weak points may be degraded.

SUMMARY

Embodiments of the present disclosure provide methods for fabricating a semiconductor device with improved reliability, which may advantageously reduce the variation in the height of the gate electrodes when implementing different threshold voltages of the transistors in the semiconductor device. Other advantages that are not mentioned above may be apparent to those skilled in the art based on the description provided below. According to some example embodiments of the present disclosure, a method may comprise providing a substrate comprising a first region, a second region, and a third region, forming a first transistor having a first threshold voltage in the first region, the first transistor comprising a first gate electrode having a first height and a first interlayer insulating film having the first height, forming a second transistor having a second threshold voltage less than the first threshold voltage in the second region, the second transistor comprising a second gate electrode having a second height less than the first height and a second interlayer insulating film having the second height, forming a third interlayer insulating film having the first height in the third region. The method may further include planarizing the first region, the second region, and the third region, wherein before planarizing the first region, the second region, and the third region, a first difference of height between an upper surface of the first region and an upper surface of the second region corresponds to a first value, and wherein after planarizing the first region, the second region, and the third region, a second difference of height between an upper surface of a planarized first region and an upper surface of a planarized second region corresponds to a second value, and wherein the first value is greater than the second value.

The first and the second transistors may be different conductivity types from each other.

The first transistor may be a P-type transistor, and the second transistor may be an N-type transistor.

The first and the second transistors may be the same conductivity type.

The substrate may further comprise a fourth region and a fourth interlayer insulating film having the second height on the substrate.

A width of the fourth interlayer insulating film may be less than a width of the third interlayer insulating film.

The substrate may further include a first part and a second part, where the first part may include the first region and the third region and the second part may include the second region.

The third interlayer insulating film may be in contact with a boundary of the first part.

The third interlayer insulating film may extend in a loop around the boundary of the first part.

According to some example embodiments of the present disclosure, a method for fabricating a semiconductor device may comprise proving a substrate comprising a first region, a second region, and a third region, forming a first interlayer insulating film in the first region and a first dummy gate formed within the first interlayer insulating film, forming a second interlayer insulating film in the second region and a second dummy gate formed within the second interlayer insulating film, forming a third interlayer insulating film in the third region, forming a first trench in the first region by removing the first dummy gate, forming a second trench in the second region by removing the second dummy gate, forming a first gate insulating film within the first and the second trenches, forming a shielding film in the first region and the third region, removing a portion of the second interlayer insulating film and the first gate insulating film of the second trench, partially removing the shielding film and the second interlayer insulating film, such that the height of the second interlayer insulating film is less than the height of the first interlayer insulating film, forming a second gate insulating film in the second trench, forming a gate electrode layer on the first interlayer insulating film and the second interlayer insulating film to fill the first and the second trenches, in the first and the second regions, partially removing the gate electrode layer, such that a first gate electrode filling the first trench and a second gate electrode filling the second trench are formed in isolation from each other, but an upper surface of the first gate electrode is higher than an upper surface of the second gate electrode and planarizing the first region, the second region, and the third region.

The partially removing the gate electrode layer may comprise planarizing the gate electrode layer.

The planarizing the gate electrode layer may be performed such that the height of the upper surface of the first interlayer insulating film and the height of the upper surface of the first gate electrode are substantially same, and the height of the upper surface of the second interlayer insulating film and the height of the upper surface of the second gate electrode are substantially same.

The planarizing the gate electrode layer may be performed such that each of the height of the first interlayer insulating film and the height of the third interlayer insulating film is greater than the height of the second interlayer insulating film.

The forming the gate electrode layer may comprise forming the gate electrode layer on the third interlayer insulating film in the third region, and the partially removing the gate electrode layer in the first and the second regions may comprise entirely removing the gate electrode layer in the third region.

The first interlayer insulating film, the second interlayer insulating film, and the third interlayer insulating film may be formed simultaneously.

A thickness of the second gate insulating film may be less than a thickness of the first gate insulating film.

According to some example embodiments of the present disclosure, a method for fabricating a semiconductor may comprise forming an interlayer insulating film on a substrate comprising a first region, a second region, a third region, and a fourth region, forming a first dummy gate in the first region and a second dummy gate in the second region, forming a first trench by removing the first dummy gate, forming a second trench by removing the second dummy gate, forming a first gate insulating film within the first trench, partially etching the interlayer insulating film of the second region and the fourth region, forming a second gate insulating film within the second trench, forming a first gate electrode within the first trench, forming a second gate electrode within the second trench and planarizing the first region, the second region, the third region, and the fourth region, wherein the substrate comprises a first part and a second part, the first part has an etch rate greater than that of the second part, the etch rate is inversely proportional to a density of gate electrodes and a width of the gate electrodes, and wherein the gate electrodes comprise the first gate electrode and the second gate electrode, and wherein the third region is positioned in the first part, and the fourth region is positioned in the second part.

The planarizing the first region, the second region, the third region, and the fourth region may be performed such that the upper surface of the first region is higher than the upper surface of the second region.

Before planarizing the first region, the second region, the third region, and the fourth region, a difference of height between the upper surface of the first region and the upper surface of the second region may correspond to a first value, after planarizing the first region, the second region, the third region, and the fourth region, the difference of height between the upper surface of the first region and the upper surface of the second region may correspond to a second value, and the first value is greater than the second value.

The partially removing the interlayer insulating film of the second region and the fourth region may comprise forming a shielding film in the first region and the third region and partially removing the interlayer insulating film of the second region and the fourth region, and then removing the shielding film.

The method may further comprise forming the first gate insulating film within the second trench and partially removing the interlayer insulating film of the second region and the fourth region, while also removing the first gate insulating film within the second trench.

BRIEF DESCRIPTION OF THE DRAWINGS

The above and other objects, features and advantages of the present disclosure will become more apparent to those of ordinary skill in the art from the detailed description below and the accompanying drawings, in which.

DETAILED DESCRIPTION

Figure 1:
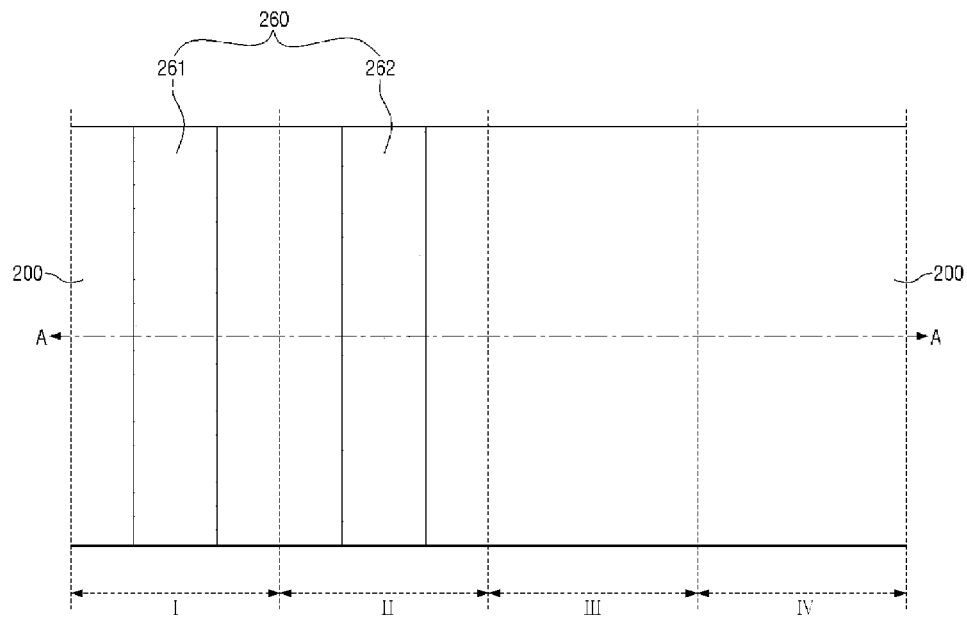
FIGS. 1 to 12 are views illustrating exemplary operations in a method of fabricating a semiconductor device according to some example embodiments.

Advantages and features of the disclosed embodiments and methods of accomplishing them will be made apparent with reference to the accompanying drawings and some embodiments to be described below. The disclosed embodiments may, however, be embodied in various different forms, and should be construed as limited, not by the embodiments set forth herein, but only by the accompanying claims. Accordingly, known processes, elements, and techniques are not described with respect to some of the disclosed embodiments. Unless otherwise noted, like reference numerals denote like elements throughout the attached drawings and written description, and thus descriptions will not be repeated. In the drawings, the sizes and relative sizes of layers and regions may be exaggerated for clarity. It will be understood that, although the terms "first", "second", "third", etc., may be used herein to describe various elements, components, regions, layers and/or sections, these elements, components, regions, layers and/or sections should not be limited by these terms. Unless indicated otherwise, these terms are used only to distinguish one element, component, region, layer and/or section from another element, component, region, layer and/or section. Thus, a first element, component, region, layer and/or section discussed below could be termed a second element, component, region, layer and/or section without departing from the teachings of the disclosure.

The terminology used herein is for the purpose of describing particular examples and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, components, and/or groups, and do not preclude the presence or addition of one or more other features, integers, steps, operations, elements, components, and/or groups.

It will be understood that when an element or layer is referred to as being "on," "connected to," "in contact with," and/or "coupled to" another element or layer, it can be directly on, connected to, in contact with and/or coupled to the other element or layer or intervening elements or layers may be present. In contrast, when an element is referred to as being "directly on," "directly connected to," or "directly coupled to" another element or layer or as "contacting" another element or layer, there are no intervening elements or layers present. Like reference numerals throughout this specification denote like elements. As used herein, the term "and/or" includes any and all combinations of one or more of the associated listed items. Also, the term "exemplary" is intended to refer to an example or illustration.

Spatially relative terms, such as "beneath," "below," "lower," "above," "upper," and the like, may be used herein for ease of description in describing one element's or feature's relationship to another/other element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" another/other element(s) or feature(s) would then be oriented "above," "on," or "on top of" the another/other element(s) or feature(s). Thus, the term "below" can encompass both an orientation of above and below. The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or one or more intervening layers may also be present.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory.

The exemplary embodiments will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the disclosed embodiments are not intended to be limited to illustrated specific forms, and may include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the disclosed embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in the same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although the figures described herein may be referred to using language such as "one embodiment" or "certain embodiments," the figures and their corresponding descriptions are not intended to be mutually exclusive from other figures or descriptions, unless the context so indicates. Therefore, certain aspects from certain figures may be the same as features in other figures and/or certain aspects from certain figures may be different representations or different portions of particular exemplary embodiments.

Herein below, methods for fabricating a semiconductor device according to some example embodiments will be explained with reference to FIGS. 1 and 12.

Figure 2:
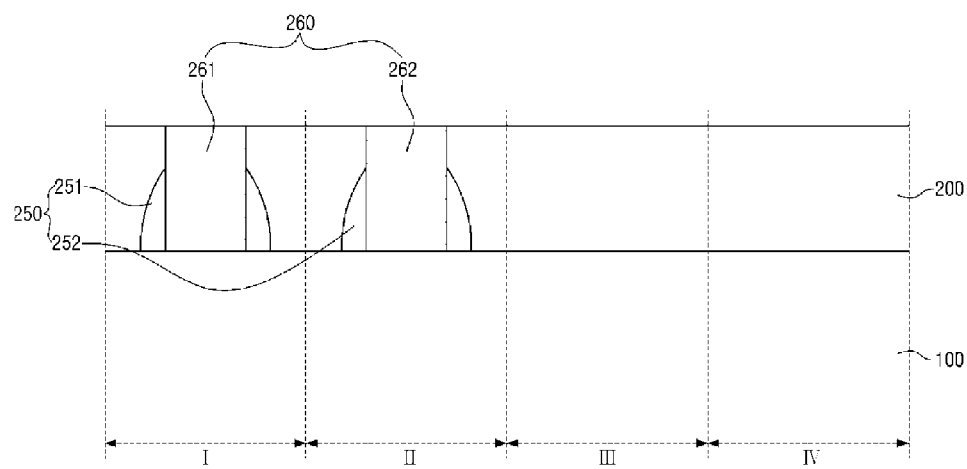

FIGS. 1 to 12 are views illustrating exemplary operations related to methods of fabricating a semiconductor device according to some example embodiments. FIG. 2 is a cross sectional view taken along a line A-A in FIG. 1. Referring to FIGS. 1 and 2, dummy gate electrodes 260 (individually, 261 and 262) may be formed on a substrate 100.

As an example, the substrate 100 may include first to fourth regions I-IV. Each of the first to the fourth regions I-IV may be adjoined with another one of the first to the fourth regions I-IV, or may be spaced from each other. Respective upper surfaces of the substrate 100 may be coplanar. That is, the upper surfaces of all the first to the fourth regions I-IV may be coplanar. The term "coplanar" refers to being at the same height. As used herein, the term "same" or "identical" may include minute differences in height, such as stepped portion(s) or dishing due to acceptable margin variations due to standard manufacturing techniques.

The first to the fourth regions I-IV in FIG. 1 may be formed in any direction with respect to each other. That is, the regions may be formed in different directions than those illustrated in FIG. 1. For convenience of illustration, FIG. 1 shows the first region I and the second region II in a direction along which the dummy gate electrode 260 extends.

The substrate 100 may be, for example, a silicon substrate, a bulk silicon or a silicon-on-insulator (SOI). In some example embodiments, the substrate 100 may include an element semiconductor such as germanium, or a compound semiconductor such as a IV-IV group compound semiconductor or a III-V group compound semiconductor, for example. In some example embodiments, the substrate 100 may be a base substrate having an epitaxial layer formed thereon.

For example, the IV-IV group compound semiconductor may be a binary compound or a ternary compound including at least two or more of carbon (C), silicon (Si), germanium (Ge), and tin (Sn), or such a binary or a ternary compound doped with a IV group element.

The III-V group compound semiconductor may be one of a binary compound, ternary compound and quaternary compound that is formed by a combination of at least one of aluminum (Al), gallium (Ga), and indium (In) as a III group element, with one of phosphorus (P), arsenic (As) and antimony (Sb) as a V group element.

The dummy gate electrodes 260 and spacers 250 may be formed in the first region I and the second region II. Specifically, a first dummy gate electrode 261 and a first spacer 251 may be formed in the first region I. A second dummy gate electrode 262 and a second spacer 252 may be formed in the second region II. The first dummy gate electrode 261 may be formed on the first region I of the substrate 100, and the second dummy gate electrode 262 may be formed on the second region II of the substrate 100. On the other hand, no dummy gate electrode may be formed in the third region III and the fourth region IV.

The first dummy gate electrode 261 that is formed in the first region I extends in one direction, and includes a long side and a short side defined in the direction of such extension. The second dummy gate electrode 262 that is formed in the second region II also extends in one direction, and includes a long side and a short side accordingly. As illustrated in FIG. 1, the directions of extension of the first dummy gate electrode 261 and the second dummy gate electrode 262 are parallel, but the invention is not limited thereto.

FIG. 2 is a cross sectional view of the first dummy gate electrode 261 and the second dummy gate electrode 262 cut along a direction parallel to the short sides of the dummy gate electrodes 261, 262. The directions of extension of the first dummy gate electrode 261 and the second dummy gate electrode 262 may be different from each other.

The first dummy gate electrode 261 and the second dummy gate electrode 262 may include polysilicon. However, the invention is not limited to this example. The first dummy gate electrode 261 and the second dummy gate electrode 262 may be replaced by a first gate electrode 30 and a second gate electrode 40 respectively, at a later stage.

The first spacer 251 may be formed on a side surface of the first dummy gate electrode 261. The first spacer 251 may include at least one of nitride film and oxynitride film. Further, unlike the example as illustrated, the first spacer 251 may be formed to have an 'L' shaped cross section (e.g., as would be shown in FIG. 2) with the leg of the 1' extending away from the corresponding dummy gate electrode 261. As depicted in the drawing, the first spacer 251 may be formed into a monolayer structure, but example embodiments are not limited thereto. Accordingly, the first spacer 251 may have a multilayer structure.

The height of the first spacer 251 may be less than the height of the first dummy gate electrode 261. Accordingly, the upper surface of the first spacer 251 may be covered by an interlayer insulating film 200. The side surface of the first dummy gate electrode 261 may be in contact with the first spacer 251 and the interlayer insulating film 200.

The second spacer 252 may be formed on the side surface of the second dummy gate electrode 262. The second spacer 252 may include at least one of nitride film and oxynitride film. Further, unlike the example as illustrated, the second spacer 252 may have a 'L' shaped cross section, as described with respect to first spacer 251. As depicted in the drawing, the second spacer 252 may have a monolayer structure, but example embodiments are not limited thereto. Accordingly, the second spacer 252 may have a multilayer structure.

The height of the second spacer 252 may be less than the height of the second dummy gate electrode 262. Accordingly, the upper surface of the second spacer 252 may be covered by the interlayer insulating film 200. The side surface of the second dummy gate electrode 262 may be in contact with the second spacer 252 and the interlayer insulating film 200.

The interlayer insulating film 200 may be formed on the substrate 100 after formation of the dummy gate electrodes 261, 262 and spacers 251, 252.

As an example, the interlayer insulating film 200 may be formed on the side surface of the spacer 250 and on the substrate 100. The interlayer insulating film 200 may be formed on the substrate 100 and contact substrate 100. As all the upper surfaces of the first to the fourth regions I-IV of the substrate 100 are coplanar, the upper surfaces of the interlayer insulating films 200 of the first to the fourth regions I-IV may also be coplanar. That is, in the upper surfaces of the first to the fourth regions I-IV, all the upper surfaces of the interlayer insulating films 200 may have the same height.

Further, the upper surface of the interlayer insulating film 200 may be coplanar with the upper surface of the dummy gate electrode 260 and the upper surface of the spacer 250. That is, the upper surface of the interlayer insulating film 200, and the upper surfaces of the dummy gate electrode 260 and the spacer 250 may be at the same height as each other. Accordingly, all the upper surfaces of the first to the fourth regions I-IV may have the same height.

For example, the interlayer insulating film 200 may be an oxide film, a nitride film, an oxynitride film or a combination thereof. In some example embodiments, for example, the interlayer insulating film 200 may include at least one of silicon oxide, silicon nitride, silicon oxynitride, and a low-k dielectric material with a dielectric constant less than silicon oxide. For example, the low-k dielectric material may include flowable oxide (FOX), Torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto. The interlayer insulating film 200 may be formed by stacking two or more insulating films.

Figure 3:
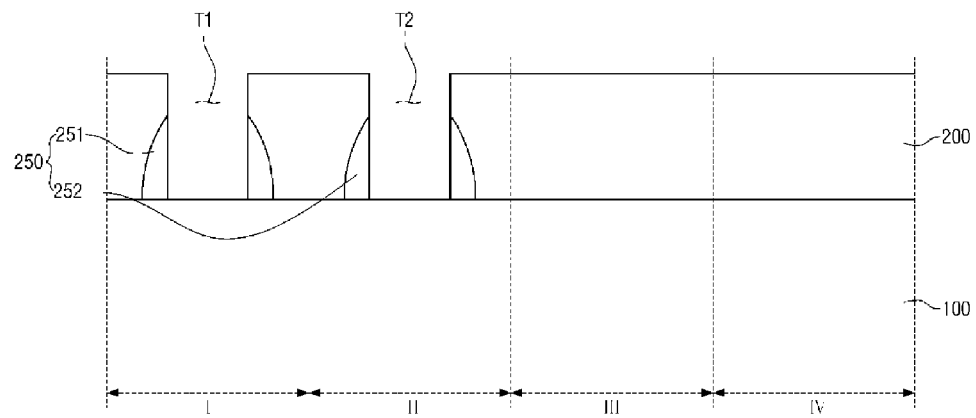

Referring to FIG. 3, first and second trenches T1 and T2 are formed by removing the dummy gate electrode 260.

Specifically, the first trench T1 may be formed by removing the first dummy gate electrode 261, and the second trench T2 may be formed by removing the second dummy gate electrode 262. The upper surface of the substrate 100 may be exposed inside the first trench T1 and the second trench T2. In one example, at this time, in the third region III and the fourth region IV, the upper surface of the substrate 100 may not be exposed due to the interlayer insulating film 200.

Figure 4:
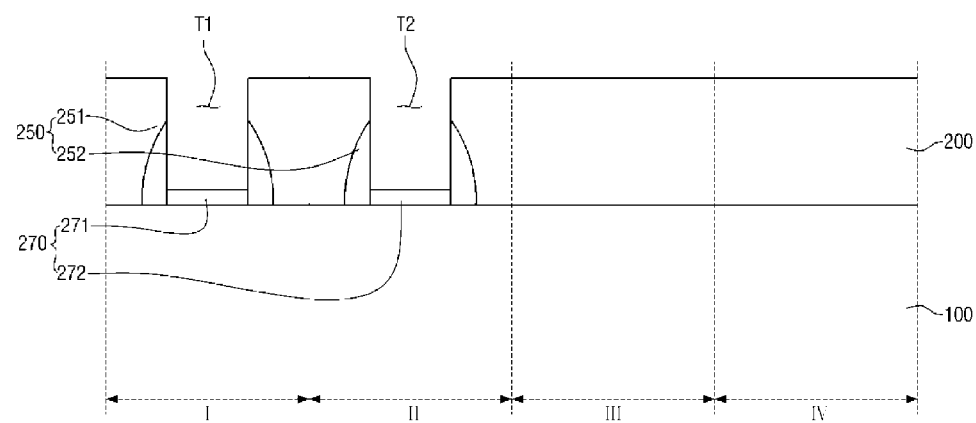

Referring to FIG. 4, a first gate insulating film 270 may be formed within the first trench T1 and the second trench T2. The first gate insulating film 270 includes the first gate insulating film 271 of the first region I, and the first gate insulating film 272 of the second region II. As an example, the first gate insulating film 271 of the first region I and the first gate insulating film 272 of the second region II may have the same thickness.

The first gate insulating film 270 may be formed conformally along the bottom surfaces of the first trench T1 and the second trench T2. As illustrated in the drawing, the first gate insulating film 270 may be formed only on the bottom surfaces of the first trench T1 and the second trench T2, but example embodiments are not limited thereto. That is, the first gate insulating film 270 may be formed conformally along the side surfaces and the bottom surfaces of the first trench T1 and the second trench T2. The first gate insulating film 270 may include a high-k dielectric material, such as one having a dielectric constant greater than 8, greater than 10 or having a dielectric constant greater than a silicon oxide film. For example, the first gate insulating film 270 may include a material selected from the group consisting of HfSiON, $HfO_2$, $ZrO_2$, $Ta_2O_5$, $TiO_2$, $SrTiO_3$ and $(Ba,Sr)TiO_3$. The first gate insulating film 270 described above may be formed to a proper thickness depending on a type of the device intended to be formed.

Figure 5:
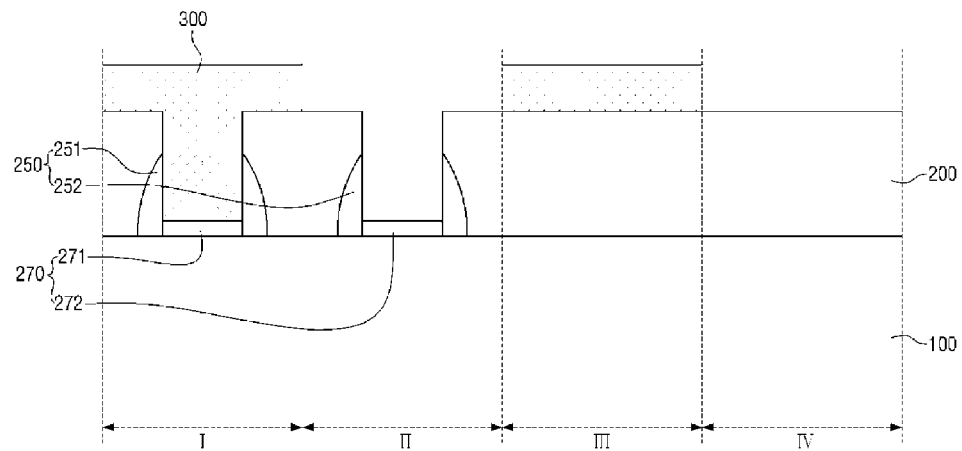

Referring to FIG. 5, a shielding film 300 is formed in the first region I and the third region III.

The shielding film 300 may fill the first trench T1 of the first region I, and may entirely cover the upper surface of the interlayer insulating film 200 of the first region I. Furthermore, the shielding film 300 may entirely cover the upper surface of the interlayer insulating film 200 in the third region III.

On the other hand, the shielding film 300 may not be formed in the second region II and the third region III. Accordingly, in the second region II, the upper surface of the interlayer insulating film 200 and the upper surface of the first gate insulating film 272 of the second region II may be exposed. Furthermore, the upper surface of the interlayer insulating film 200 may be exposed in the fourth region IV.

The shielding film 300 may be formed to cover all of the first to the fourth regions I-IV, and then patterned with photolithography process to expose the second region II and the fourth region IV except the first region I and the third region III. However, the invention is not limited to the specific examples provided above. Accordingly, other patterning methods may be used.

Figure 6:
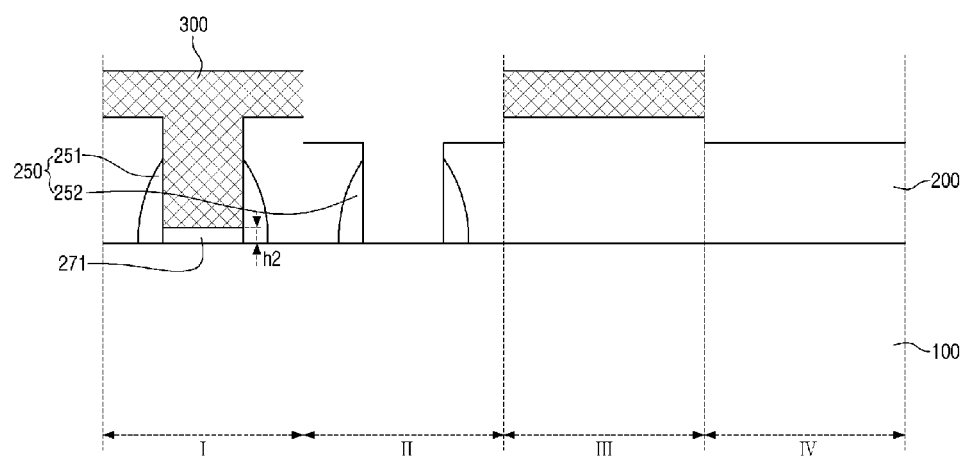

Referring to FIG. 6, the first gate insulating film 272 of the second region II may be removed. The first gate insulating film 272 of the second region II may be removed with wet etching. Specifically, the wet etching may involve process of removing the first gate insulating film 272 of the second region II, which may be an oxide, using HF as an etchant. Further, after the HF wet etching process, additional process of chemical oxide removal (COR) may be employed to entirely remove the first gate insulating film 272 from the second region II.

In one example, at this time, the interlayer insulating film 200 of the second region II and the interlayer insulating film 200 of the fourth region IV, which are not covered by the shielding film 300, but exposed, may be partially removed. That is, a portion of the interlayer insulating film 200 of the second region II and a portion of the upper surface of the interlayer insulating film 200 in the fourth region IV may be removed, causing the heights of the interlayer insulating film 200 of the second region II and the interlayer insulating film 200 in the fourth region IV to be decreased.

Thus, the height of the interlayer insulating film 200 of the first region I and the height of the interlayer insulating film 200 of the third region III may be greater than the height of the interlayer insulating film 200 of the second region II and the height of the interlayer insulating film 200 of the fourth region IV by a first height h1. In one example, at this time, the height of the second spacer 252 may be decreased accordingly (e.g., if the height of the interlayer insulating film 200 in the second region II is reduced to expose and etch the second spacer 252). However, the invention is not limited to the specific example provided above. Accordingly, the height of the second spacer 252 may not be decreased, but maintained.

Figure 7:
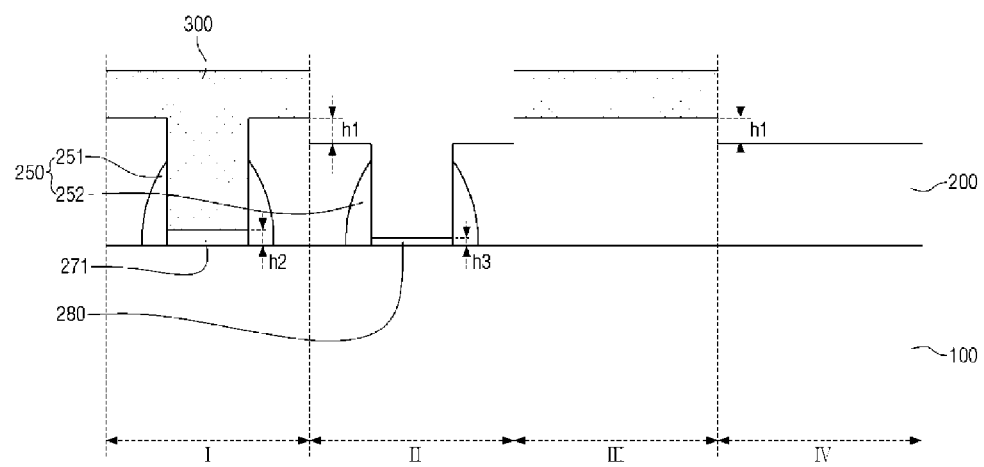

Referring to FIG. 7, the second gate insulating film 280 may be formed within the second trench T2.

The second gate insulating film 280 may be formed conformally along the bottom surface of the second trench T2. As illustrated in the drawing, the second gate insulating film 280 may be formed only on the bottom surface of the second trench T2, but example embodiments are not limited thereto. That is, the second gate insulating film 280 may be formed conformally along the side surface and the bottom surface of the second trench T2. The second gate insulating file may also be formed on upper surfaces of the exposed interlayer insulating film 200 in regions II and IV as well as on upper surfaces of shielding film 300 (not shown). The second gate insulating film 280 may include a high-k dielectric material having a dielectric constant greater 8 or greater than 10 or greater than a silicon oxide film. For example, the second gate insulating film 280 may include a material selected from the group consisting of HfSiON, $HfO_2$, $ZrO_2$, $Ta_2O_5$, $TiO_2$, $SrTiO_3$ and $(Ba,Sr)TiO_3$. The second gate insulating film 280 described above may be formed to a proper thickness depending on a type of the device intended to be formed.

The second gate insulating film 280 may be formed to be thinner than the first gate insulating film 271. That is, the first thickness h2 of the first gate insulating film 271 may be greater than the second thickness h3 of the second gate insulating film 280. The first thickness h2 of the first gate insulating film 271 may have been increased as the second gate insulating film 280 was formed. However, example embodiments are not limited to the example given above. That is, comparing the first thickness h2 of the resulting first gate insulating film 271 completed with the process and the second thickness h3 of the resulting second gate insulating film 280 completed with the process, may indicate that the first thickness h2 is greater than the second thickness h3.

The thicknesses of the gate insulating films 270 and 280 may be closely related with the threshold voltage of the transistor. That is, as the thickness of the gate insulating films 270 and 280 increases, the threshold voltage of the transistor also increases. Accordingly, the transistor having the first gate insulating film 271 of the first region I may have a higher threshold voltage compared to the transistor having the second gate insulating film 280 of the second region II.

For example, the transistor having the first gate insulating film 271 of the first region I and the transistor having the second gate insulating film 280 of the second region II may have different conductivity types from each other. Specifically, the transistor having the first gate insulating film 271 of the first region I may be a P type, and the transistor having the second gate insulating film 280 of the second region II may be an N type. However, example embodiments are not limited to the example given above.

For example, the transistor having the first gate insulating film 271 of the first region I and the transistor having the second gate insulating film 280 of the second region II may have the same conductivity type as each other. Specifically, both the transistor having the first gate insulating film 271 of the first region I and the transistor having the second gate insulating film 280 of the second region II may be P type or N type. It is noted that even the same conductivity type may have varied threshold voltages. That is, the threshold voltage of the transistor having the first gate insulating film 271 of the first region I may be higher than that of the transistor having the second gate insulating film 280 of the second region II.

Figure 8:
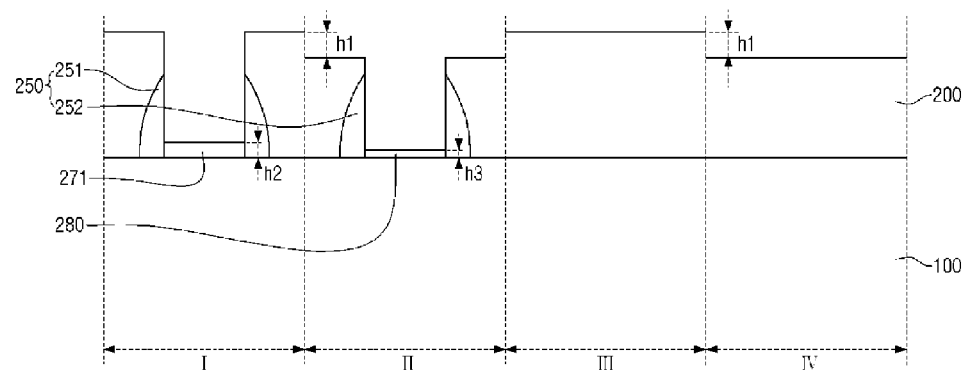

Referring to FIG. 8, the shielding film 300 may be removed.

As the shielding film 300 formed in the first region I and the third region III is removed, the first region I and the third region III may be exposed. That is, the upper surface of the interlayer insulating film 200, the inner side surface of the first spacer 251, and the upper surface of the first gate insulating film 271 of the first region I may be exposed. In the third region III, the upper surface of the interlayer insulating film 200 may be exposed.

Figure 9:
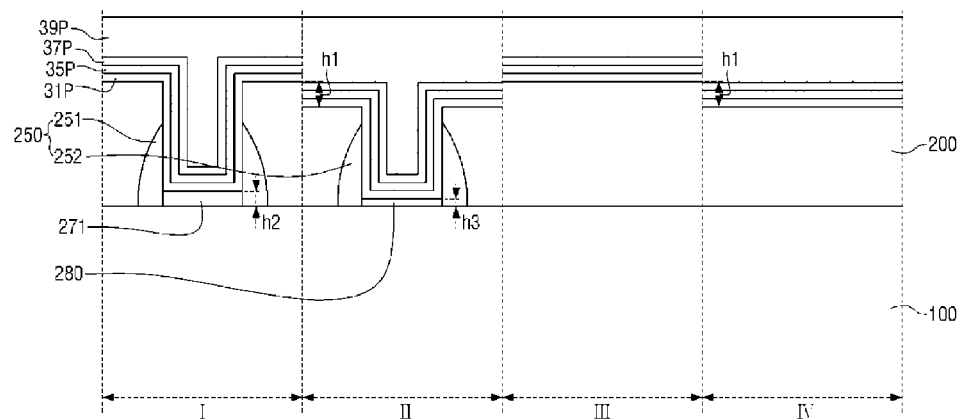

Referring to FIG. 9, a gate electrode layer is formed.

The gate electrode layer includes a pre-capping film 31*p*, a pre-functional film 35*p*, and a gate metal film 39*p*. The gate electrode layer may be formed conformally, but since the interlayer insulating film 200 has different heights in respective regions, the height of the gate electrode layer may also vary.

The pre-capping film 31*p* may be formed on the gate insulating films 271 and 280 within the first trench T1 and the second trench T2. As illustrated, the pre-capping film 31*p* may be formed conformally along the sidewalls and the bottom surfaces of the first trench T1 and the second trench T2. The pre-capping film 31*p* may include TiN and/or TaN for example, and may be formed to have a thickness suitable for a type of the device intended to be formed. For example, the pre-capping film 31*p* may be formed to have a thickness of approximately from 5 Å to 30 Å. The pre-capping film 31*p* may be formed in the other region and may be used when etching unnecessary work function adjustment film.

The pre-functional film 35*p* may then be formed on the pre-capping film 31*p*. The pre-functional film 35*p* may be used to adjust the work function of the transistor. A barrier metal film 37*p* may be formed on the pre-functional film 35*p*. The gate metal film 39*p* may then be formed on the barrier metal film 3'7*p*. The gate metal film 39*p* may entirely fill the first trench T1 and the second trench T2.

Figure 10:
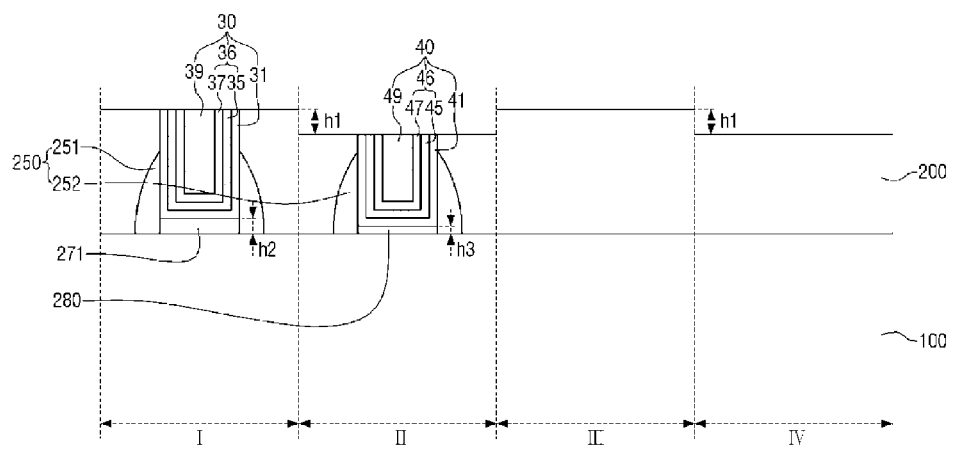

Referring to FIG. 10, device isolation may be performed by planarizing gate electrode layer.

That is, the gate electrode layer may be located only within the first trench T1 and the second trench T2, while the rest may be removed. Accordingly, the first gate electrode 30 is formed in the first trench T1 of the first region I, and the second gate electrode 40 is formed in the second trench T2 of the second region II. The first gate electrode 30 may include a first capping film 31, a first function film 36 and a first gate metal 39. The second gate electrode 40 may include a second capping film 41, a second function film 46 and a second gate metal 49. The capping films 31 and 41 may include at least one of titanium (Ti) and tantalum (Ta). The capping films 31 and 41 may be formed of a metal nitride (e.g., containing at least one of titanium nitride (TiN) and tantalum nitride (TaN)), a metal carbide, a metal silicide, a metal silicon nitride, and a metal silicon carbide.

The first function film 36 may include a first work function adjustment film 35 and a first barrier metal 37. The first barrier metal 37 may be conformally formed on the first work function adjustment film 35. As both the first work function adjustment film 35 and the first barrier metal 37 are formed conformally, the first function film 36 may form a trench.

The first work function adjustment film 35 may be used to adjust the work function of the first gate electrode 30. The first barrier metal 37 may protect the first work function adjustment film 35, and prevent the first work function adjustment film 35 from being influenced by the first gate metal 39.

The second function film 46 may include a second work function adjustment film 45 and a second barrier metal 47. The second barrier metal 47 may be conformally formed on the second work function adjustment film 45. As both the second work function adjustment film 45 and the second barrier metal 47 are formed conformally, the second function film 46 may form a trench.

The second work function adjustment film 45 may be used to adjust the work function of the second gate electrode 40. The second barrier metal 47 may protect the second work function adjustment film 45, and prevent the second work function adjustment film 45 from being influenced by the second gate metal 49.

The first work function adjustment film 35 and the second work function adjustment film 45 may be N-, or P-type work function adjustment films. When the first work function adjustment film 35 and the second work function adjustment film 45 are N-types, these may include a material selected from the group consisting of TiAl, TiAlN, TaC, TiC, and HfSi, for example.

When the first work function adjustment film 35 and the second work function adjustment film 45 are P-types, these may include a material selected from the group consisting of Mo, Pd, Ru, Pt, TiN, WN, TaN, Ir, TaC, RuN and MoN, for example.

The first barrier metal 37 and the second barrier metal 47 may include TiN, for example.

The first gate metal 39 may be formed on the first barrier metal 37. Specifically, the first gate metal 39 may be formed to fill the first trench T1 on the first barrier metal 37. The first gate metal 39 may include a material selected from the group consisting of Al, W, metal carbide, metal nitride, metal silicide, metal aluminum carbide, metal aluminum nitride, metal aluminum, and metal silicon nitride, but not limited thereto.

The second gate metal 49 may be formed on the second barrier metal 47. Specifically, the second gate metal 49 may be formed to fill the second trench T2 on the second barrier metal 47. The second gate metal 49 may include a material selected from the group consisting of Al, W, metal carbide, metal nitride, metal silicide, metal aluminum carbide, metal aluminum nitride, metal aluminum, and metal silicon nitride, but not limited thereto. In one example, at this time, the heights of the upper surfaces of the first gate electrode 30 and the second gate electrode 40 may be different from each other, which may result from the etching process described with respect to FIG. 6 (e.g., to etch gate insulating layer 272). There may be a height difference h1 between the interlayer insulating film 200 of the first region I and the interlayer insulating film 200 of the second region II based on the process of forming the second gate insulating film

280. Specifically, the height of the upper surface of the first gate electrode 30 may be greater than the height of the upper surface of the second gate electrode 40.

Figure 11:
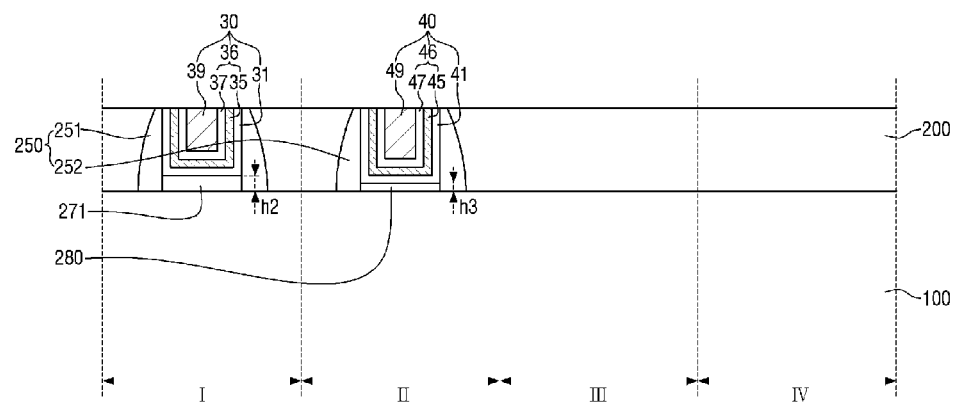
Figure 12:
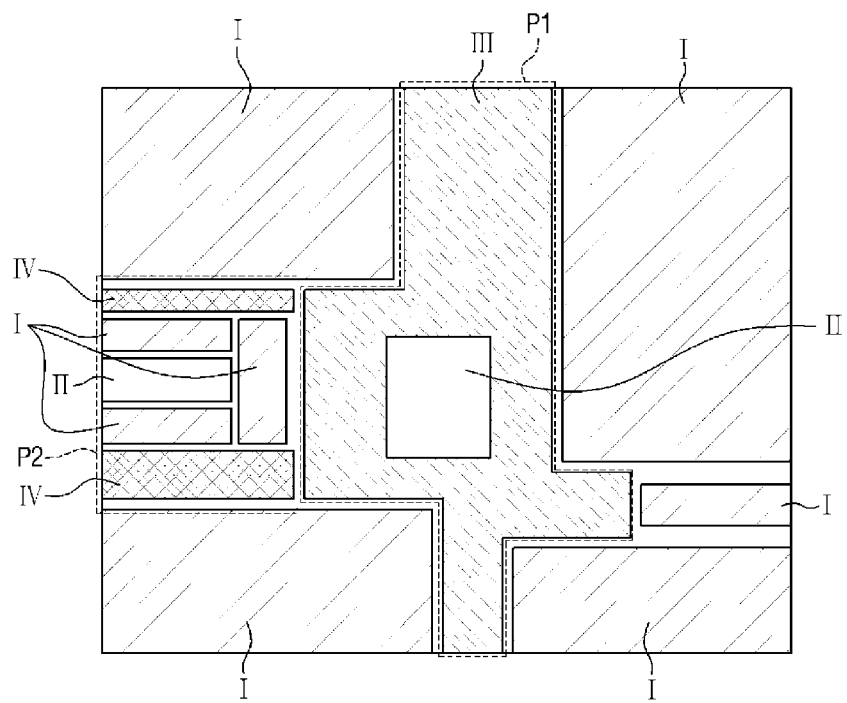

Referring to FIGS. 11 and 12, a planarization process is performed for the first to the fourth regions I-IV.

The planarization process may be chemical mechanical polishing (CMP). While the drawings illustrate that the upper surfaces of the first to the fourth regions I-IV are entirely planarized, the heights of the first gate electrode 30 and the second gate electrode 40 may be different from each other due to the previous presence of a stepped portion having a step size of h1 which has been originally formed there (e.g., as shown in FIG. 10). To ensure smooth planarization, the first to the fourth regions I-IV may be arranged to reduce or remove such height differences.

FIG. 12 is a diagram showing an exemplary layout of the semiconductor device in FIG. 11.

Referring to FIGS. 11 and 12, the first region I and the second region II are the regions where the transistor, i.e., the gate electrode is formed, and the third region III and the fourth region IV are the regions where the interlayer insulating film 200 is formed without the transistor.

The first region I and the third region III are the regions that have the relatively higher upper surfaces compared to the second region II and the fourth region IV. On the other hand, the second region II and the fourth region IV are the regions that have the relatively lower upper surfaces compared to the first region I and the third region III. The fourth region IV may have a narrower width compared to the third region III. The width may correspond to the length of the short side, among the long side and the short side as defined when the third region III and the fourth region IV are in rectangular shape.

The substrate 100 may be divided into the first to the fourth regions I-IV, or in another aspect, the substrate 100 may include a first part P1 and a second part P2. The first part P1 and the second part P2 may be defined by etch rate.

The etch rate may be determined by the density of the gate electrodes, the widths of the gate electrodes, proportion of a number of the relatively higher gate electrodes to a number of the relatively lower gate electrodes, and a size of an area of regions including high etch rate features as compared to the size of an area of neighboring regions including low etch rate features. For example, the etch rate may be in inverse proportion to the density of the gate electrodes, widths of the gate electrodes, proportion of the relatively lower gate electrodes to the relatively higher gate electrodes, and the size of an area including relatively low etch rate features, and the size of an area including relatively low etch rate features to the size of neighboring areas including relatively high etch rate features. The gate electrode is the concept that includes the first gate electrode 30 and the second gate electrode 40, and the part is the concept that corresponds to the first part P1 or the second part P2.

A high etch rate may indicate more etching is done in the planarization process than the relatively low etch rate. Accordingly, the part with a higher etch rate may have its upper surface lowered more during the planarization process.

Compared to the second part P2, the first part P1 may refer to the part with a higher etch rate. That is, this is a portion where the height of the gate electrode is decreased more by the planarization process.

According to an exemplary embodiment, a method for fabricating a semiconductor device may involve ensuring that the height of the gate electrode of the second region II is not decreased or decreased to a lessor extent, by arranging, in the first part P1, a region (i.e., third region III) of which upper surface has a relatively high height compared to the second region II. That is, when the portion in the first part P1 where the gate electrode is formed is decreased in height during planarization process, such reduction in height can be kept relatively low by forming the interlayer insulating film 200 in the first part P1 at a relatively high height. However, even when including region III as part of the first part P1, the reduction in the height of gate electrodes in the first region I in the first part P1 may be decreased. However, the height of the gate electrodes of the second region II (and upper surfaces of region IV if included in the first part P1) may be kept the same height or just decreased slightly. This is because, in one example, the upper surface of the region III may be relatively higher than the upper surface of the second region II and the fourth region IV.

The second part P2 may comprise gate electrodes of the first region I. The gate electrodes of the first region may be intermixed with and/or surrounded by the fourth region IV as well as gate electrodes of the second region II. Further, the density and/or widths of the gate electrodes of the first region I in the second part P2 may be made less than the respective density and/or widths of the gate electrodes of the first region I in the first part P1. The second part P2 may have no or very little portions comprising the third region III. The first part P1 may have no or very little portions comprising the fourth region IV. The first part P1 may have a first ratio of an area of the second region to an area of the third region III less than 0.5. The second part P2 may have a second ratio equal to the area of the first region I to the combined area of the second region and fourth region IV that is less than 0.5.

When the interlayer insulating film 200 of the third region III surrounds the second region II including the gate electrode, the surrounded second region II and the surrounding interlayer insulating film 200 of the third region III may form the first part P1. In one example, at this time, the boundary of the first part P1 may be with the same as the boundary of the third region III surrounding one or more second regions II. However, the invention is not limited to the example given above.

Figure 13:
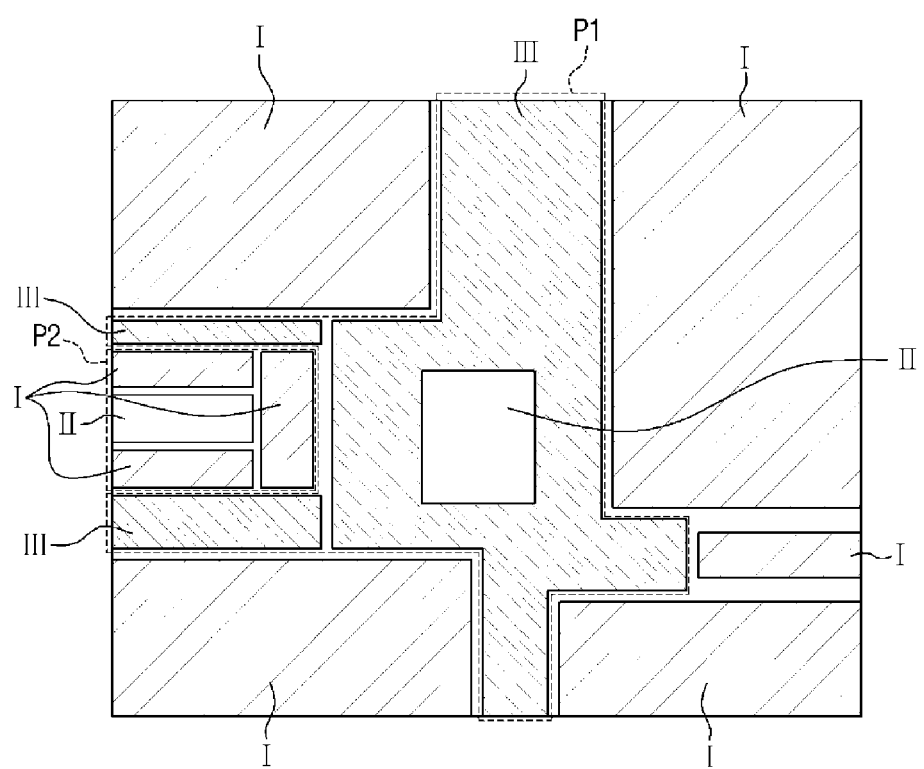
FIG. 13 is a layout diagram illustrating a method of fabricating a semiconductor device according to some example embodiments.

FIG. 13 is a layout diagram provided to explain an alternative semiconductor device according to some example embodiments. In the example of FIG. 13, the interlayer insulating film 200 may be formed in the third region III region only (i.e., without the fourth region IV). That is, in this example, in the entire semiconductor device, the height of the interlayer insulating film 200 may be kept from being decreased by forming the shielding film 300 at a region where the dummy gate electrode 260 is not formed.

Herein below, a method for fabricating a semiconductor device according to some example embodiments will be explained with reference to FIGS. 12 and 14 to 19. In the following description, the disclosure provided in connection with the example embodiments already provided above will not be provided in detail. It will be understood that the method described with respect to FIGS. 14 to 19 is also applicable to FIG. 13.

Figure 14:
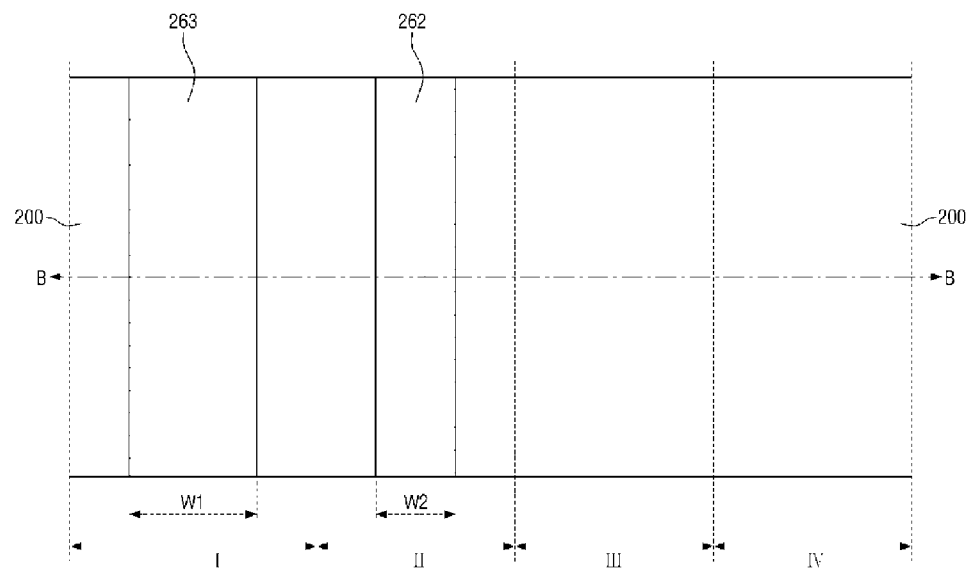
FIGS. 14 to 19 are views illustrating exemplary operations in a method of fabricating a semiconductor device according to some example embodiments.
Figure 15:
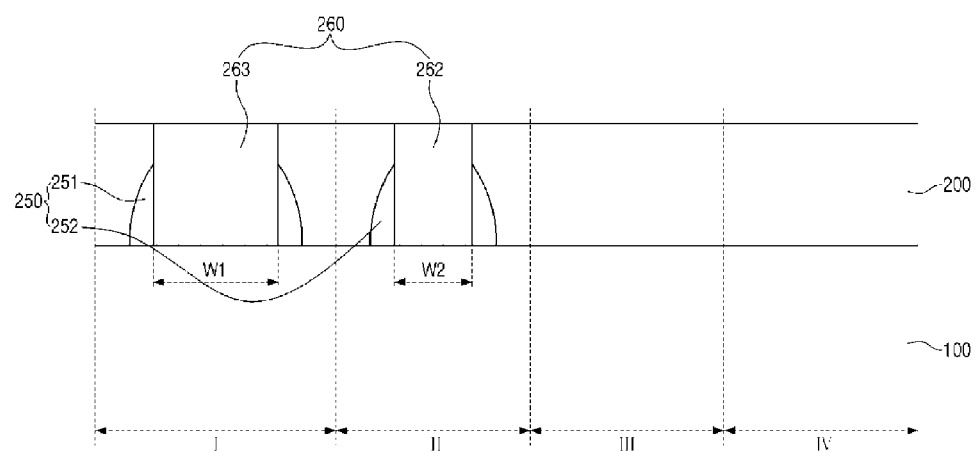

FIGS. 14 to 19 are views illustrating exemplary operations in a method for fabricating a semiconductor device according to some example embodiments. FIG. 15 is a cross sectional view taken along the line B-B of FIG. 14.

Referring to FIGS. 14 and 15, the third dummy gate electrode 263 may be formed in the first region I of the substrate 100, and the second dummy gate electrode 262 may be formed in the second region II of the substrate 100. On the other hand, there may be no dummy gate electrode 260 formed in the third region III and the fourth region IV.

The third dummy gate electrode 263 formed in the first region I extends in one direction, and includes a long side and a short side defined in the direction of such extension. The second dummy gate electrode 262 formed in the second region II also extends in one direction, and includes a long side and a short side accordingly. As illustrated in FIG. 14, the directions of extension of the third dummy gate electrode 263 and the second dummy gate electrode 262 may be parallel, although example embodiments are not limited thereto.

FIG. 15 is a cross sectional view of the third dummy gate electrode 263 and the second dummy gate electrode 262 cut along a direction of the short side, respectively. The directions of extension of the third dummy gate electrode 263 and the second dummy gate electrode 262 may be different from each other.

The third dummy gate electrode 263 may have a first width W1 in a short side direction, and the second dummy gate electrode 262 may have a second width W2 in a short side direction. The first width W1 may be greater than the second width W2. The first width W1 and the second width W2 may be within a range between 0 nm and 1 µm, although example embodiments are not limited thereto.

Figure 16:
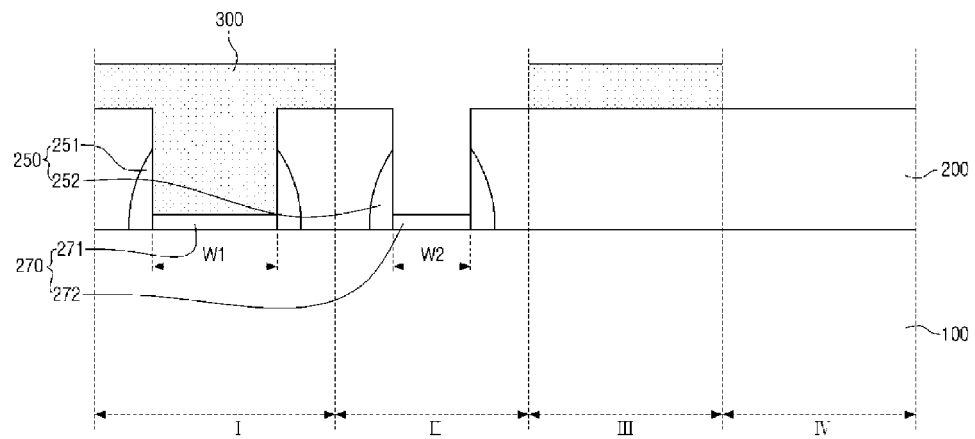

Referring to FIG. 16, the third dummy gate electrode 263 and the second dummy gate electrode 262 are removed, and the first gate insulating film 270 is formed. As an example, the first gate insulating film 270 includes the first gate insulating film 271 of the first region I, and the first gate insulating film 272 of the second region II. The first gate insulating film 271 of the first region I and the first gate insulating film 272 of the second region II may have substantially the same thickness. The widths of the first gate insulating film 271 and the second gate insulating film 272 may vary from each other, depending on widths W1, W2 of the third dummy gate electrode 263 and the first dummy gate electrode 261. That is, the width W1 of the first gate insulating film 271 may be greater than the width W2 of the second gate insulating film 272.

The first gate insulating film 270 may be conformally formed along the upper surface of the substrate. The first gate insulating film 270 described above may be formed to have a proper thickness depending on a type of the device intended to be formed.

The shielding film 300 may then be formed in the first region I and the third region III.

The shielding film 300 may fill the trench of the first region I, and may entirely cover the upper surface of the interlayer insulating film 200 of the first region I. Further, the shielding film 300 may entirely cover the upper surface of the interlayer insulating film 200 in the third region III.

On the other hand, the shielding film 300 may not be formed in the second region II and the third region III. Accordingly, in the second region II, the upper surface of the interlayer insulating film 200 and the upper surface of the first gate insulating film 272 of the second region II may be exposed. Further, the upper surface of the interlayer insulating film 200 may be exposed in the fourth region IV.

The shielding film 300 may be formed to cover all of the first to the fourth regions I to IV, and then patterned with photolithography process to expose the second region II and the fourth region IV except the first region I and the third region III. However, example embodiments are not limited to the specific examples provided above. Accordingly, other patterning method may be used.

Figure 17:
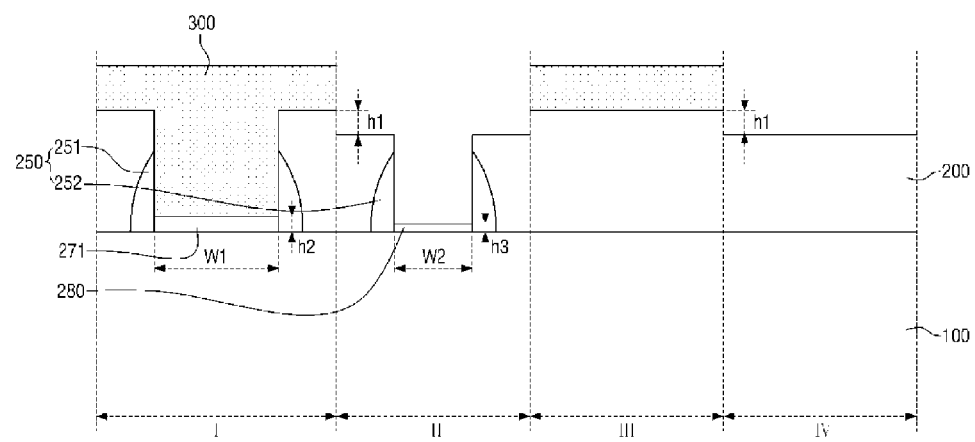

Referring to FIG. 17, the first gate insulating film 272 of the second region II may be removed. In one example, at this time, the interlayer insulating film 200 of the second region II and the interlayer insulating film 200 of the fourth region IV, which are not covered by the shielding film 300, but exposed, and may be partially removed. A portion of the upper surface of the interlayer insulating film 200 of the second region II and a portion of the upper surface of the interlayer insulating film 200 of the fourth region IV may be removed, causing the heights of the interlayer insulating film 200 of the second region II and the interlayer insulating film 200 in the fourth region IV to be decreased.

The height of the interlayer insulating film 200 of the first region I and the height of the interlayer insulating film 200 of the third region III may be greater than the height of the interlayer insulating film 200 of the second region II and the height of the interlayer insulating film 200 of the fourth region IV by a first height h1. After removal of the first gate insulating film 272 of the second region II the second gate insulating film 280 may be formed on the surface of the exposed substrate 100 within the trench in the second region II.

Figure 18:
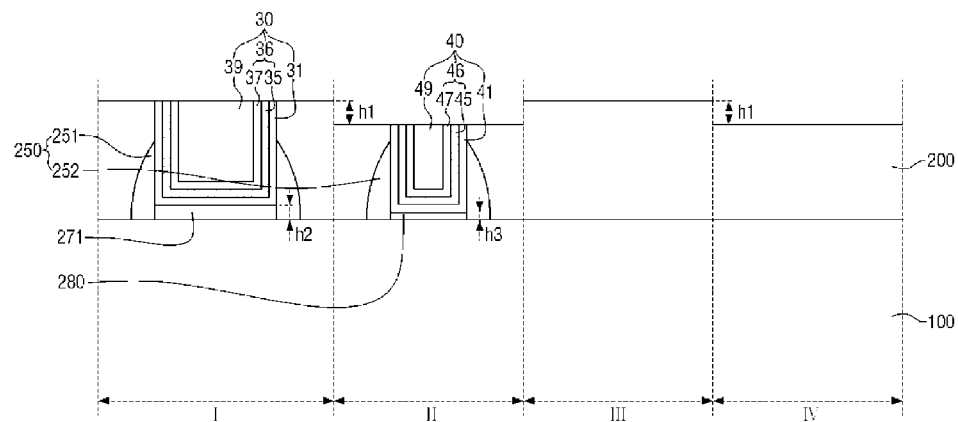

Referring to FIG. 18, the gate electrode layer may be formed and device isolation may be performed by planarization.

As an example, the gate electrode layer may be located only within the trenches from which the third dummy gate electrode 263 and the second dummy gate electrode 262 are formed, while the rest of the gate electrode layer may be removed. Accordingly, the first gate electrode 30 is formed in the trench of the first region I, and the second gate electrode 40 is formed in the trench of the second region II. The first gate electrode 30 includes a first capping film 31, a first function film 36 and a first gate metal 39. The second gate electrode 40 includes a second capping film 41, a second function film 46 and a second gate metal 49.

In one example, at this time, the heights of the upper surfaces of the first gate electrode 30 and the second gate electrode 40 may be different from each other, due to the etching process to remove the first gate insulating film 272 of the second region II. There also may be a height difference between the upper surface of the interlayer insulating film 200 of the first region I and that of the interlayer insulating film 200 of the second region II based on the process of forming the second gate insulating film 280. Specifically, the height of the upper surface of the first gate electrode 30 may be greater than the height of the upper surface of the second gate electrode 40.

Figure 19:
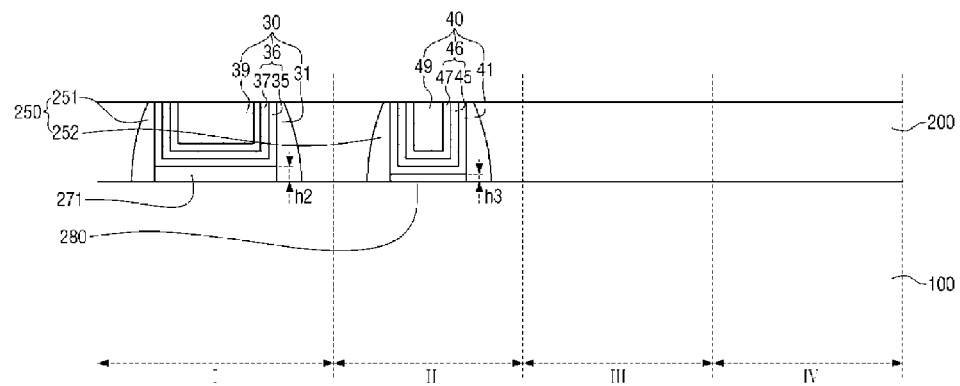

Referring to FIGS. 19 and 12, planarization process may be performed for the first to the fourth regions I-IV.

The width of the first gate electrode 30 is the first width W1, and the width of the second gate electrode 40 is the second width W2. That is, the width of the second gate electrode 40 is less than the width of the first gate electrode 30. Accordingly, the etch rate of the second region II where the second gate electrode 40 is located, may be greater than that of the first region I. Accordingly, to avoid or reduce the higher etch rate caused by the relatively smaller width of the second gate electrode 40 as compared to the first gate electrode 30, the first to the fourth regions I-IV may be arranged to as described herein.

The substrate 100 may be divided into the first to the fourth regions I-IV, or in another aspect, the substrate 100 may include a first part P1 and a second part P2. The first part P1 and the second part P2 may be defined by etch rate.

In order to ensure that the height of the gate electrode of the first part P1 is not decreased or if decreased, decreased slightly, the third region III, i.e., the region where the height of the upper surface is relatively higher than the fourth region IV, may be arranged in the first part P1. That is, when the portion in the first part P1 where the gate electrode is formed is decreased in height during planarization process, such reduction in height can be kept to be relatively low by forming the interlayer insulating film 200 in the first part P1 at a relatively high height.

Herein below, effects of a method for fabricating a semiconductor device according to some example embodiments will be explained with reference to FIGS. 20 to 22.

Figure 20:
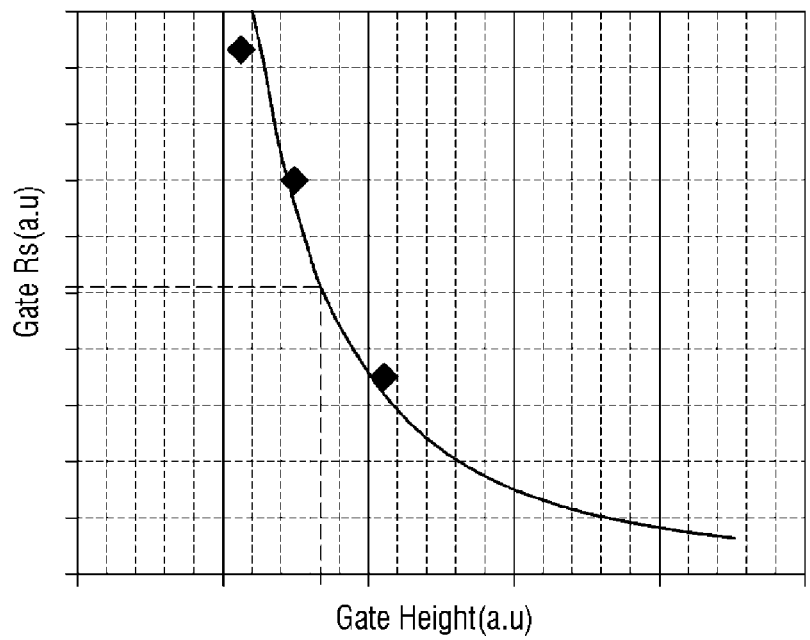
FIG. 20 is a graph illustrating exemplary resistance of gate electrodes according to a respective height of the gate electrode of a semiconductor device, in a method of fabricating a semiconductor device according to some example embodiments.

FIG. 20 is a graph provided to explain resistance of a gate electrode according to the height of gate electrode of a semiconductor device, in a method for fabricating a semiconductor device according to some example embodiments. FIG. 21 is a graph provided to explain height of a gate electrode according to density of the gate electrodes of a semiconductor device, in a method for fabricating a semiconductor device according to some example embodiments. FIG. 22 is a graph provided to explain height of a gate electrode according to density of a thick gate insulating film region of a semiconductor device, in a method for fabricating a semiconductor device according to some example embodiments.

Referring to FIG. 20, it is noted that the gate resistance increases as the height of the gate electrode decreases. This means excessively high resistance is formed as the work function adjustment film under the gate metal is exposed. Furthermore, leakage current may be generated when the height of the gate electrode is decreased.

Figure 21:
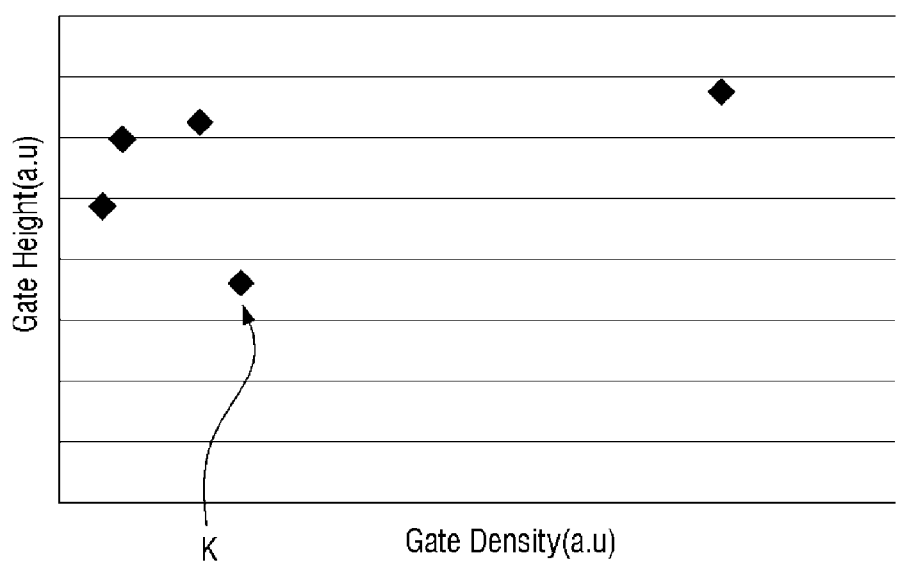
FIG. 21 is a graph illustrating exemplary height of gate electrodes according to the density of the gate electrodes of a semiconductor device, in a method of fabricating a semiconductor device according to some example embodiments.

Referring to FIG. 21, it is noted that the height of the gate electrode decreases, as the density of the gate electrodes decrease. As the density of the gate electrodes is decreased, the pressure of the planarization process may be focused at the respective gate electrodes, thus reducing the heights of the respective gate electrodes. However, there is an exceptional portion K. The exceptional portion refers to a portion that has a relatively lower proportion of transistors having relatively high upper surfaces and high threshold voltages. This will be explained below with reference to FIG. 22.

Figure 22:
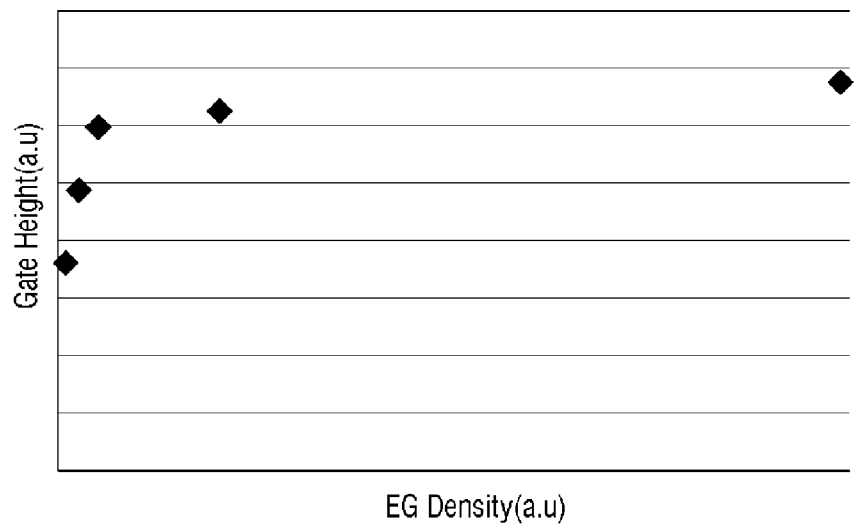
FIG. 22 is a graph illustrating exemplary height of gate electrodes according to the density of a thick gate insulating film region of a semiconductor device, in a method of fabricating a semiconductor device according to some example embodiments.

Referring to FIG. 22, the height of the gate electrode according to the EG density, i.e., according to the proportion of the transistors having relatively high upper surfaces and high threshold voltages. The height of the gate electrode decreases as the EG density decreases.

Accordingly, the etch rate may be determined by considering the factors mentioned above, i.e., the density of gate electrodes, the widths of gate electrodes, the proportion of high gate electrodes to low gate electrodes, and the area of the relevant part of the substrate.

According to an example embodiment, a method of fabricating a semiconductor device can reduce planarization process pressure concentrating on the neighboring gate electrodes by forming the interlayer insulating film 200 at a relatively high height for a part that has a high etch rate. As a result, the reduction in height of the gate electrodes due to planarization process can be suppressed, and the difference in height between gate electrodes within the chip can be decreased, which in turn may increase the reliability of the semiconductor device.

Figure 23:
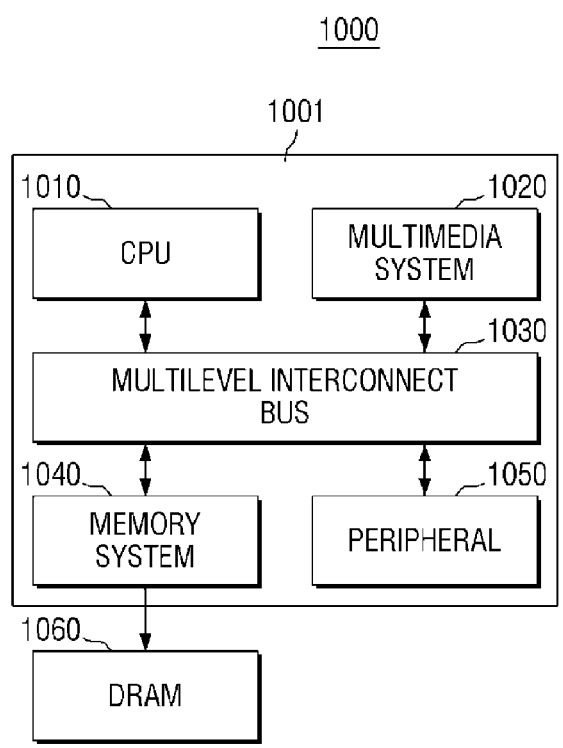
FIG. 23 is a block diagram of an exemplary SoC system including a semiconductor device according to some example embodiments.

FIG. 23 is a block diagram of a SoC system comprising a semiconductor device according to some example embodiments.

Referring to FIG. 23, a SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some exemplary embodiments, the CPU 1010 may include a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some example embodiments, the bus 1030 may have a multi-layer structure. Specifically, an example of the bus 1030 may be a multi-layer advanced high-performance bus (AHB), or a multi-layer advanced eXtensible interface (AXI), although example embodiments are not limited to these.

The memory system 1040 may enable application processor 1001 to connect to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may enable the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be arranged externally to the application processor 1001, as illustrated. Specifically, the DRAM 1060 may be packaged into a package on package (PoP) type of system with the application processor 1001.

At least one of the above-mentioned components of the SoC system 1000 may include at least one of the semiconductor devices according to the example embodiments explained above.

Figure 24:
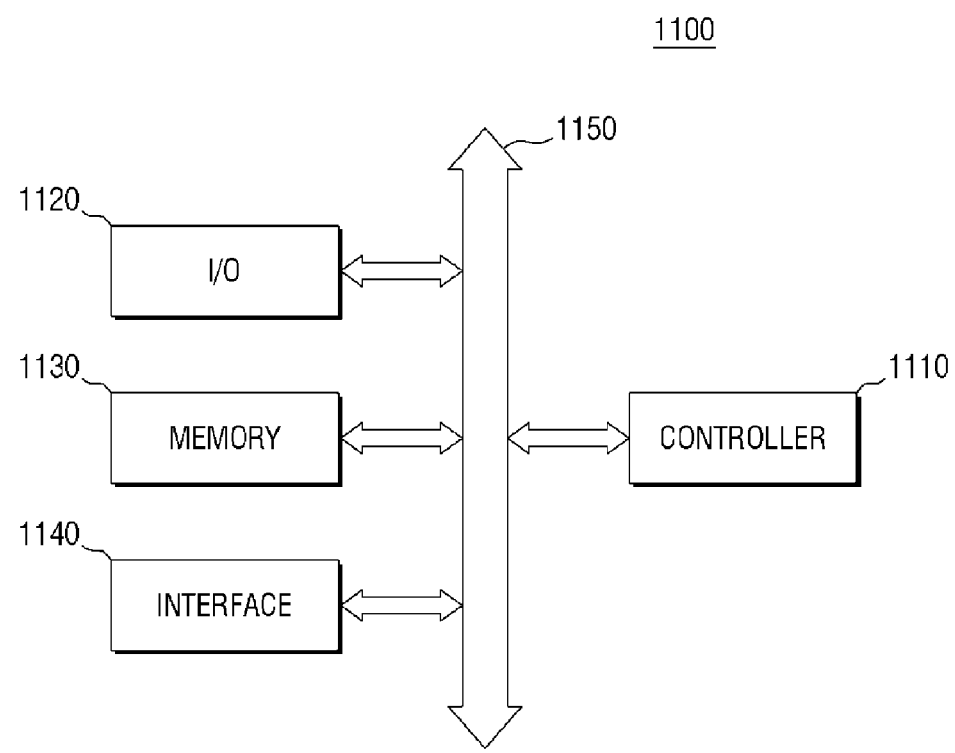
FIG. 24 is a block diagram of an exemplary electronic system including a semiconductor device according to some example embodiments.

FIG. 24 is a block diagram of an electronic system comprising a semiconductor device according to example embodiments.

Referring to FIG. 24, the electronic system 1100 according to some example embodiments may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal processor, micro-controller and logic devices capable of performing functions similar to those mentioned above. The I/O device 1120 may include a keypad, a keyboard or a display device. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

According to the example embodiments described above, the semiconductor device may be provided within the memory device 1130, or provided as a part of the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 25:
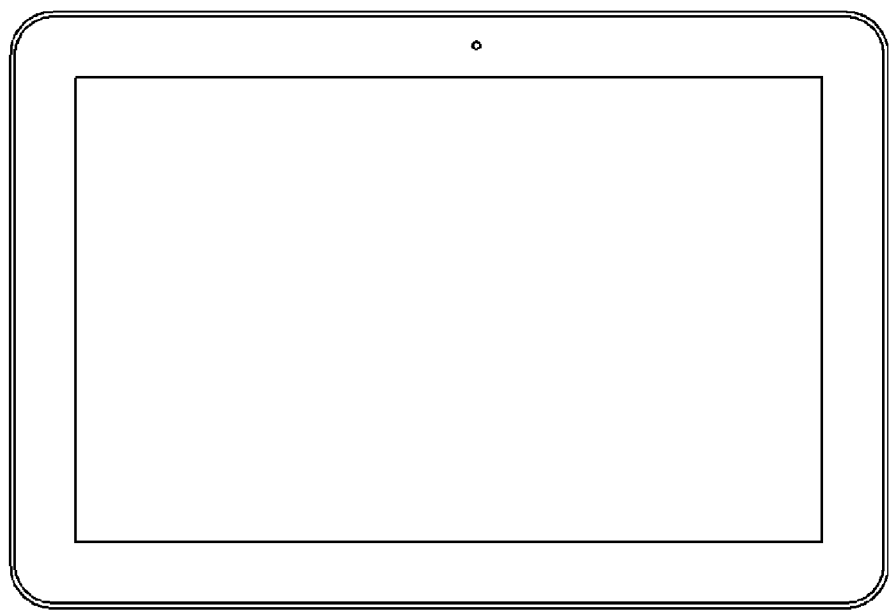
FIGS. 25 through 27 illustrate exemplary systems that may include a semiconductor device according to some example embodiments.
Figure 27:
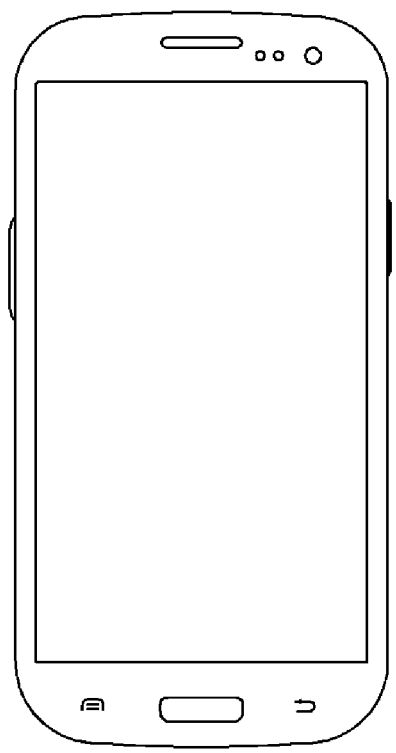

FIGS. 25 and 27 illustrate example semiconductor systems that may include a semiconductor device according to example embodiments.

Figure 26:
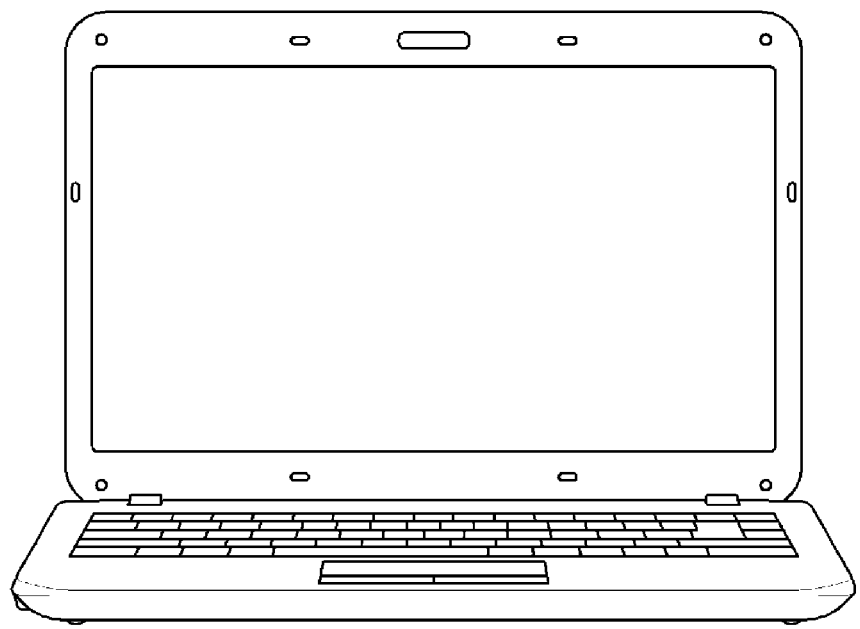

FIG. 25 illustrates a tablet PC 1200, FIG. 26 illustrates a laptop computer 1300, and FIG. 27 illustrates a smartphone 1400. According to the example embodiments explained above, the semiconductor device may be used in these devices, i.e., in the tablet PC 1200, the laptop computer 1300 or the smartphone 1400.

Further, it is apparent to those skilled in the art that the semiconductor device according to example embodiments described above is applicable to other integrated circuit based devices and systems not illustrated herein.

That is, while the tablet PC 1200, the laptop computer 1300 and the smartphone 1400 are illustrated herein as a semiconductor system according to the example embodiments, the semiconductor systems are not limited to any of the examples given above.

In some example embodiments, the semiconductor system may be realized as a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

What is claimed is:

1. A method comprising:
providing a substrate comprising at least a first region, a second region, and a third region;
forming a first transistor having a first threshold voltage in the first region, the first transistor comprising a first gate electrode having a first height and a first interlayer insulating film having the first height;
forming a second transistor having a second threshold voltage less than the first threshold voltage in the second region, the second transistor comprising a second gate electrode having a second height less than the first height and a second interlayer insulating film having the second height;
forming a third interlayer insulating film having the first height in the third region; and
planarizing a first part including the first region with a first etch rate and a second part including the second region and the third region with a second etch rate greater than the first etch rate, and
wherein before planarizing the first part and the second part, a first difference of height between an upper surface of the first region and an upper surface of the second region corresponds to a first value, and wherein after planarizing the first part and the second part, a second difference of height between an upper surface of a planarized first region and an upper surface of a planarized second region corresponds to a second value, and wherein the first value is greater than the second value.

2. The method of claim 1, wherein the first transistor and the second transistor are different conductivity types from each other.

3. The method of claim 2, wherein the first transistor is a P-type transistor, and the second transistor is an N-type transistor.

4. The method of claim 1, wherein the first transistor and the second transistor are a same conductivity type.

5. The method of claim 1, wherein the substrate further comprises a fourth region and a fourth interlayer insulating film having the second height on the substrate.

6. The method of claim 5, wherein a width of the fourth interlayer insulating film is less than a width of the third interlayer insulating film.

7. The method of claim 1, wherein the third interlayer insulating film is in contact with a boundary of the first part.

8. The method of claim 7, wherein the third interlayer insulating film extends in a loop around the boundary of the first part.

9. A method comprising:
providing a substrate comprising at least a first region, a second region, and a third region;
forming a first interlayer insulating film in the first region and a first dummy gate within the first interlayer insulating film;
forming a second interlayer insulating film in the second region and a second dummy gate within the second interlayer insulating film;
forming a third interlayer insulating film in the third region;
forming a first trench in the first region by removing the first dummy gate;
forming a second trench in the second region by removing the second dummy gate;
forming a first gate insulating film within the first trench and the second trench;
forming a shielding film in the first region and the third region;
removing a portion of the second interlayer insulating film and the first gate insulating film of the second trench;
partially removing the shielding film and the second interlayer insulating film, such that a height of the second interlayer insulating film is less than a height of the first interlayer insulating film;
forming a second gate insulating film in the second trench;
forming a gate electrode layer on the first interlayer insulating film and the second interlayer insulating film to fill the first trench and the second trench;
in the first region and the second region, partially removing the gate electrode layer, such that a first gate electrode filling the first trench and a second gate electrode filling the second trench are formed in isolation from each other, but an upper surface of the first gate electrode is higher than an upper surface of the second gate electrode; and
planarizing the first region, the second region, and the third region.

10. The method of claim 9, wherein partially removing the gate electrode layer comprises planarizing the gate electrode layer.

11. The method of claim 10, wherein the planarizing the gate electrode layer is performed such that a height of the upper surface of the first interlayer insulating film and a height of the upper surface of the first gate electrode are substantially same, and a height of the upper surface of the second interlayer insulating film and a height of the upper surface of the second gate electrode are substantially same.

12. The method of claim 10, wherein the planarizing the gate electrode layer is performed such that each of a height of the first interlayer insulating film and a height of the third interlayer insulating film is greater than a height of the second interlayer insulating film.

13. The method of claim 11, wherein the forming the gate electrode layer comprises forming the gate electrode layer on the third interlayer insulating film in the third region, and the partially removing the gate electrode layer in the first region and the second region comprises entirely removing the gate electrode layer in the third region.

14. The method of claim 9, wherein each of the first interlayer insulating film, the second interlayer insulating film, and the third interlayer insulating film is formed simultaneously.

15. The method of claim 9, wherein a thickness of the second gate insulating film is less than a thickness of the first gate insulating film.

16. A method comprising:

forming an interlayer insulating film on a substrate comprising at least a first region, a second region, a third region, and a fourth region;

forming a first dummy gate in the first region and a second dummy gate in the second region;

forming a first trench by removing the first dummy gate;

forming a second trench by removing the second dummy gate;

forming a first gate insulating film within the first trench;

partially etching the interlayer insulating film of the second region and the fourth region;

forming a second gate insulating film within the second trench;

forming a first gate electrode within the first trench;

forming a second gate electrode within the second trench; and planarizing the first region, the second region, the third region, and the fourth region, wherein the substrate comprises a first part and a second part, the first part has an etch rate greater than that of the second part, the etch rate is inversely proportional to a density of gate electrodes and a width of the gate electrodes, and the gate electrodes comprise the first gate electrode and the second gate electrode, and wherein the third region is positioned in the first part, and the fourth region is positioned in the second part.

17. The method of claim 16, wherein the planarizing the first region, the second region, the third region, and the fourth region is performed such that an upper surface of the first region is higher than an upper surface of the second region.

18. The method of claim 17, wherein, before planarizing the first region, the second region, the third region, and the fourth region, a difference of height between the upper surface of the first region and the upper surface of the second region corresponds to a first value, after planarizing the first region, the second region, the third region, and the fourth region, the difference of height between the upper surface of the first region and the upper surface of the second region corresponds to a second value, and the first value is greater than the second value.

19. The method of claim 16, wherein partially removing the interlayer insulating film of the second region and the fourth region comprises:

forming a shielding film in the first region and the third region; and partially removing the interlayer insulating film of the second region and the fourth region, and then removing the shielding film.

20. The method of claim 16, further comprising:

forming the first gate insulating film within the second trench; and partially removing the interlayer insulating film of the second region and the fourth region, while also removing the first gate insulating film within the second trench.

* * * * *